United States Patent
Chen et al.

(10) Patent No.: US 10,984,993 B2
(45) Date of Patent: Apr. 20, 2021

(54) PLASMA PROCESSING APPARATUS

(75) Inventors: Peng Chen, Beijing (CN); Mengxin Zhao, Beijing (CN); Gang Wei, Beijing (CN); Liang Zhang, Beijing (CN); Bai Yang, Beijing (CN); Guilong Wu, Beijing (CN); Peijun Ding, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 639 days.

(21) Appl. No.: 13/876,133

(22) PCT Filed: Dec. 22, 2010

(86) PCT No.: PCT/CN2010/080121
§ 371 (c)(1),
(2), (4) Date: May 31, 2013

(87) PCT Pub. No.: WO2012/040986
PCT Pub. Date: Apr. 5, 2012

(65) Prior Publication Data
US 2013/0256129 A1    Oct. 3, 2013

(30) Foreign Application Priority Data

Sep. 27, 2010   (CN) .......................... 201010294210.8

(51) Int. Cl.
*H01J 37/34*   (2006.01)
*H01J 37/32*   (2006.01)
(Continued)

(52) U.S. Cl.
CPC ........ *H01J 37/3488* (2013.01); *C23C 14/358* (2013.01); *C23C 14/50* (2013.01);
(Continued)

(58) Field of Classification Search
CPC ........... H01J 37/32467; H01J 37/32651; H01J 37/3411; H01J 37/32871; H01J 37/3488;
(Continued)

(56) References Cited

U.S. PATENT DOCUMENTS 5,763,851 A  *  6/1998  Forster .............. H01J 37/32477
                                                      156/345.48
5,800,688 A  *  9/1998  Lantsman ............. H01J 37/321
                                                         204/192.12
(Continued)

FOREIGN PATENT DOCUMENTS

CN          1265222 A       8/2000
CN          1265222 A       8/2000
(Continued)

OTHER PUBLICATIONS

International Search Report of PCT/CN2010/080121.
(Continued)

*Primary Examiner* — Michael A Band
(74) *Attorney, Agent, or Firm* — Anova Law Group, PLLC (57) ABSTRACT

A plasma processing apparatus includes a chamber (20) and a target (25) above the chamber (20). The surface of the target (25) contacts the processing area of the chamber (20). The chamber (20) includes an insulating sub-chamber (21) and a first conductive sub-chamber (22), which are superposed. The first conductive sub-chamber (22) is provided under the insulating sub-chamber (21). The insulating sub-chamber (21) is made of insulating material, and the first conductive sub-chamber (22) is made of metal material. A Faraday shield component (10) which is made of metal material or insulating material electroplated with conductive coatings and includes at least one slit is provided in the insulating sub-chamber (21). An inductance coil (13) surrounds the exterior of the insulating sub-chamber (21). The
(Continued)

problem about the wafer contamination due to particles formed on the surface of the coil during the sputtering process can be solved by using the plasma processing apparatus.

19 Claims, 3 Drawing Sheets

(51) Int. Cl.
    *C23C 14/50*     (2006.01)
    *C23C 14/35*     (2006.01)

(52) U.S. Cl.
    CPC .. *H01J 37/32467* (2013.01); *H01J 37/32651* (2013.01); *H01J 37/3411* (2013.01); *H01J 37/3441* (2013.01)

(58) Field of Classification Search
    CPC ........... H01J 37/32431; H01J 37/32458; H01J 37/32798; H01J 37/32807; C23C 14/358; C23C 14/564; C23C 14/50
    See application file for complete search history.

(56) References Cited

U.S. PATENT DOCUMENTS

| | | | | |
|---|---|---|---|---|
| 5,948,215 | A * | 9/1999 | Lantsman | ........... H01J 37/3405 |
| | | | | 204/192.12 |
| 6,080,287 | A * | 6/2000 | Drewery | ............... C23C 14/345 |
| | | | | 204/192.12 |
| 6,117,279 | A | 9/2000 | Smolanoff et al. | |
| 6,190,513 | B1 * | 2/2001 | Forster | ................. H01J 37/321 |
| | | | | 204/192.12 |
| 6,251,242 | B1 | 6/2001 | Fu et al. | |
| 6,494,998 | B1 * | 12/2002 | Brcka | ................... H01J 37/321 |
| | | | | 118/723 I |
| 6,758,948 | B2 * | 7/2004 | Johnson | .............. C23C 14/3407 |
| | | | | 204/192.12 |
| 7,018,506 | B2 * | 3/2006 | Hongoh | ................ C23C 16/507 |
| | | | | 118/723 AN |
| 2007/0074968 | A1 * | 4/2007 | Vukovic | ............. H01J 37/3405 |
| | | | | 204/192.1 |
| 2007/0102286 | A1 * | 5/2007 | Scheible | ............. C23C 14/3407 |
| | | | | 204/298.01 |

FOREIGN PATENT DOCUMENTS

| | | |
|---|---|---|
| EP | 801413 A1 * | 10/1997 |
| JP | 2007227443 A | 9/2007 |
| JP | 2007227443 A | 9/2007 |
| KR | 1020010020136 | 4/2001 |
| KR | 1020010089324 | 11/2004 |
| WO | WO 2012/040986 A1 | 8/2000 |

OTHER PUBLICATIONS

PCT/CN2010/080121 English Translation of International Search Report dated Jun. 30, 2011.
PCT/CN2010/080121 English Translation of International Written Opinion dated Jun. 30, 2011.
PCT/CN2010/080121 English Translation of International Preliminary Report of Patentability dated Apr. 2, 2013.
Singapore Patent Application No. 201302282-7, Invitation to Respond to Written Opinion, dated Feb. 13, 2014.
WIPO Application No. PCT/CN2010/080121, International Search Report, dated Jun. 30, 2011.
WIPO Application No. PCT/CN2010/080121, Written Opinion of the International Searching Authority, dated Jun. 30, 2011.
WIPO Application No. PCT/CN2010/080121, International Preliminary Report on Patentability, dated Apr. 2, 2013.

* cited by examiner

Fig.6

PLASMA PROCESSING APPARATUS

CROSS-REFERENCE TO RELATED APPLICATIONS

This application is the national phase under 35 U.S.C. § 371 of PCT International Application No. PCT/CN2010/080121, filed Dec. 22, 2010, which claims the benefit of Chinese Patent Application No. 201010294210.8, filed Sep. 27, 2010, the entire contents of the aforementioned applications are hereby incorporated herein by reference.

FIELD OF THE INVENTION

The present invention relates to the field of semiconductor manufacturing technical, and in particular, relates to a plasma processing apparatus.

BACKGROUND OF THE INVENTION

A plasma processing apparatus is widely used in the manufacturing process of current integrated circuits, solar cells, flat panel displays, etc. The plasma processing apparatus widely used in industries includes the following types: for example, direct-current discharge plasma, capacitive coupled plasma (CCP), inductive coupled plasma (ICP) and electron cyclotron resonance (ECR) plasma. These types of plasma processing apparatus are currently used in the process of Physical Vapor Deposition (PVD), dry-etching, Chemical Vapor Deposition (CVD), etc.

In the PVD process, Magnetron sputtering technology is most widely used. The technology is to connect the high-power direct current power supply to the target (for example, metal or metal oxide, the typical metal is Cu, Ta, etc), and bombard the target with plasma generated by the direct current power supply so that the material of the target is deposited on the wafer to be processed so as to form a film. In addition, a magnetron is arranged above the target to increase sputtering efficiency.

In the current advanced process, especially in the PVD process for integrated circuits, in order to increase conformal coverage of pores, the plasma density is enhanced by using an induction coil, so that bias on the lower electrode can more efficiently attract ions to deposit on the wafer or etch the wafer, so as to meet the process requirements.

Figure 1:
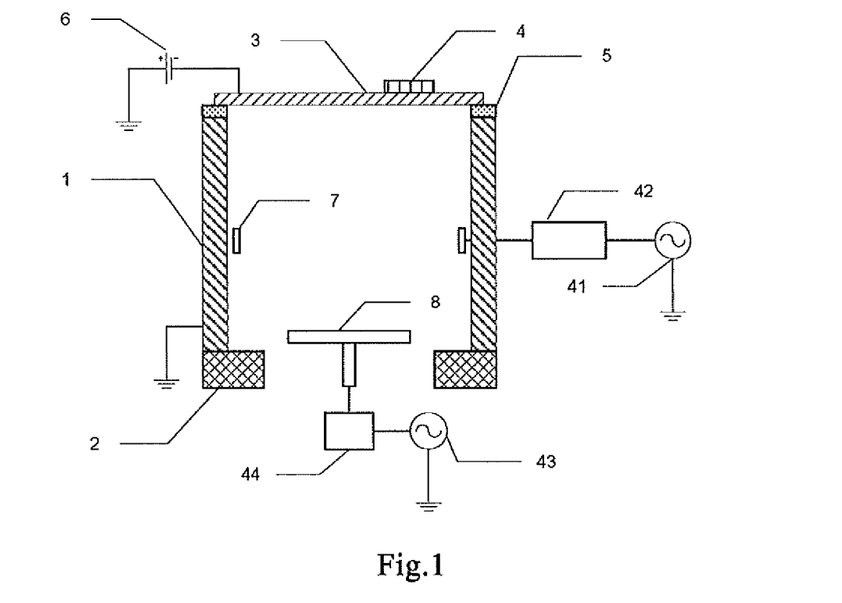
FIG. 1 is a schematic view of the structure of a current PVD apparatus.

FIG. 1 is a schematic view of the structure of a current PVD apparatus. As shown in FIG. 1, the reaction chamber consists of two parts, a sidewall 1 and a bottom wall 2, a target 3 is provided on the top of the reaction chamber, a magnetron 4 is provided on the target 3, the first RF power supply 41 is connected with the coil 7 via the first matching network 42, and the second RF power supply 43 is connected with the electrostatic chuck 8 via the second matching network 44. The direct current power supply 6 applies direct-current power to the target 3 to generate plasma and attract ions in the plasma to bombard the target 3 so that after being sputtered, the material of the target 3 can be deposited on the wafer (not shown in FIG. 1) on the electrostatic chuck 8. In addition, the RF power applied to the electrostatic chuck 8 can generate RF self-bias to attract ions, so that the effect of pore-filling can be improved. The coil 7 applies the RF power of the first RF power supply 41 into the reaction chamber, so as to further increase the plasma density and improve the effect of deposition coverage of the target material on the wafer.

However, the problem is in that since the coil 7 is provided inside of the reaction chamber and the coil 7 has a very high RF bias, it is very likely that the coil 7 is sputtered by plasma. To prevent the coil from being sputtered to introduce impurities, the coil 7 and the target 3 shall be made of the same material, thus flexibility in material selection is affected and the cost of the apparatus is increased. A more serious problem is in that the coil 7 is in the reaction chamber and many particles will be accumulated on the surface of the coil, which will easily contaminate the wafer to be processed and at the same time the utilization efficiency of the target will be reduced.

SUMMARY OF THE INVENTION

The present invention provides a plasma processing apparatus, which can solve at least the problem of the wafer contamination due to particles formed on the surface of the coil during sputtering.

The problem of target utilization can be further solved so that the utilization efficiency of the target can be improved.

In order to solve the above problems, the present invention provides a plasma processing apparatus including: a chamber and a target above the chamber, the target is located above the chamber so that the surface of the target contacts the processing area inside the chamber, The chamber includes an insulating sub-chamber and a first conductive sub-chamber which are superposed, the first conductive sub-chamber is provided under the insulating sub-chamber, the insulating sub-chamber is made of insulating material, the first conductive sub-chamber is made of metal material;

A Faraday shield component is provided inside the insulating sub-chamber, the Faraday shield component is made of metal material, or of insulating material electroplated with conductive coatings, the Faraday shield component includes at least one slit; and The insulating sub-chamber is externally surrounded by an induction coil.

Alternatively, the insulating sub-chamber is a hollow cylinder.

Alternatively, the Faraday shield component is a hollow cylinder.

The lower edge of the insulating sub-chamber is provided with a flange facing toward the inside of the insulating sub-chamber, and the flange is used for supporting the Faraday shield component.

Preferably, the plasma processing apparatus further includes a first blocking component, which is provided at the joint of the flange and the Faraday shield component, and extends toward the direction of the first conductive sub-chamber in a suspended state.

Preferably, the plasma processing apparatus further includes an isolation component, which is provided between the target and the insulating sub-chamber.

Preferably, the plasma processing apparatus further includes a second blocking component, which is provided at the joint of the insulating sub-chamber and the isolation component and extends toward the direction of the insulating sub-chamber in a suspended state.

Preferably, the plasma processing apparatus further includes a second conductive sub-chamber, which is provided between the isolation component and the insulating sub-chamber.

Preferably, the plasma processing apparatus further includes a third blocking component, which is provided at the joint of the second conductive sub-chamber and the isolation component, and extends to the joint of the insulating sub-chamber and the second conductive sub-chamber in a suspended state.

Preferably, the plasma processing apparatus further includes a coil protection cover, which is provided outside of the conduction coil.

Preferably, the slit of the Faraday shield component in the plasma processing apparatus is filled with insulating material.

Preferably, the plasma processing apparatus is a physical vapor deposition device.

The above technical solutions have following advantages:

In the embodiments of the present invention, the Faraday shield component functions as the Faraday shield, and the induction coil, the insulating sub-chamber and the Faraday shield component constitute an induction coil system. Since the inductance of the Faraday shield component is relatively small, compared to the coil in the metal chamber of the conventional technology (see FIG. 1), with the same input power, the voltage on the Faraday shield component is relatively low. So the RF bias on the internal surface of the Faraday shield component is relatively low, which can efficiently prevent particles such as metal ions from depositing on the Faraday shield component during the process. Moreover, since the induction coil is provided outside of the chamber, the issue that the coil is sputtered to form particles which will contaminate the wafer can be avoided, and useless loss of the target material can be avoided so that the utilization efficiency of the target can be improved.

Moreover, a relatively low bias prevents the Faraday shield component from attracting ion bombardment and becoming a wearing part, so the working life of the apparatus can be increased and the cost can be reduced.

BRIEF DESCRIPTION OF THE DRAWINGS

From Figures, the above and other objects, features and advantages of the present invention will be apparent. Throughout the figures, like reference signs represent like parts. The figures are not drawn in scale and the focus is to illustrate the inventive concept of the present invention.

DETAILED DESCRIPTION OF THE PREFERRED EMBODIMENTS

In order to make the above objects, features and advantages of the present invention more easily understood, the particular embodiments of the present invention will be described in detail below taken in conjunction with the figures.

Many particular details are cited in the following description so as to facilitate understanding the present invention thoroughly. However, the present invention may be implemented by other ways different from those described herein, so the present invention is not limited to the particular embodiments disclosed below.

Secondly, the present invention is described in connection with the schematic views. When the embodiments of the present invention are described in detail, the cross-sectional views showing the structures of the apparatus may be enlarged partly without proportion, and the schematic views are just illustrative and not to limit the protection scope of the present invention. In addition, the three-dimensional dimensions of length, width and depth should be included in the actual manufacturing process.

In order to highlight features of the present invention, parts that are not directly relevant to the inventive concepts of the present invention are not drawn in the Figures.

Currently, one of the important factors that affect the processing quality is particle contamination in the reaction chamber of the plasma processing apparatus. In the PVD plasma processing apparatus provided with an induction coil, the issue of particle contamination is more serious. The inventor has found after study that the induction coil provided inside of the reaction chamber has a very high RF bias which makes it easy for the induction coil to be sputtered by plasma, and this is one of sources of the contaminant particles inside the reaction chamber. In order to avoid contamination, the material of the coil can be selected to be the same as that of the target. However, this will affect flexibility in material selection and increase the cost of the apparatus.

In view of above, the present invention provides a plasma processing apparatus, in which the conduction coil is provided outside of the reaction chamber, and the RF bias is reduced by using a built-in Faraday shield component so as to efficiently prevent the target ion depositing on the internal surface of the Faraday shield component. A particular embodiment of the plasma processing apparatus of the present invention will be described below in connection with the accompanying figures.

The First Embodiment

Figure 2:
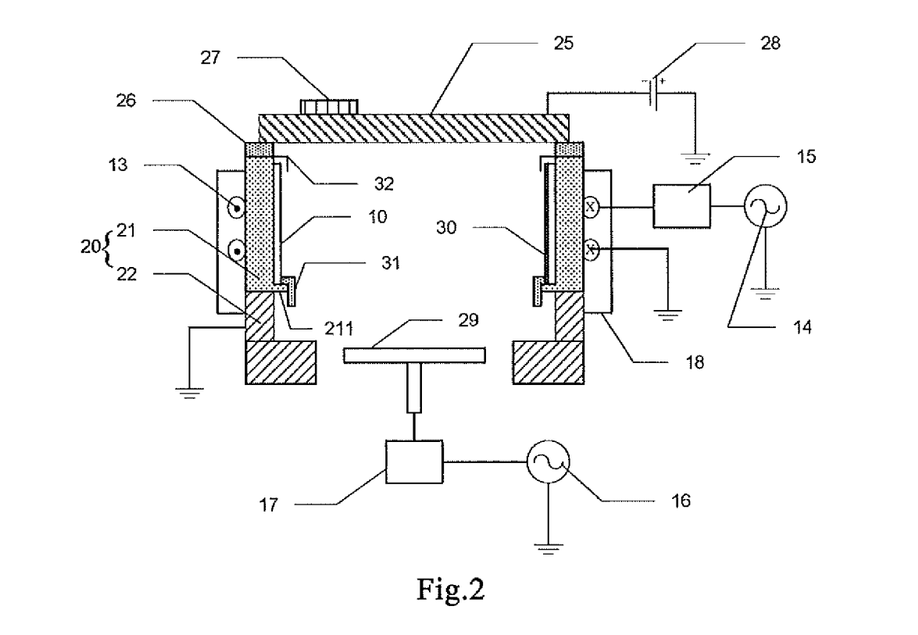
FIG. 2 is a schematic view of the structure of a plasma processing apparatus according to a first embodiment.

FIG. 2 is a schematic view of a structure of the plasma processing apparatus according to the first embodiment. As shown in FIG. 1, the plasma processing apparatus includes: a chamber 20 and a top cover 25 above the chamber 20.

The chamber 20 is shaped to be a cylinder and includes an insulating sub-chamber 21 and a first conductive sub-chamber 22 which are superimposed and fixedly connected hollow cylinders; the first conductive sub-chamber 22 is provided under the insulating sub-chamber 21 and is a cylindrical component provided with a bottom wall; the top cover 25 is provided on the insulating sub-chamber 21. The top cover 25, the insulating sub-chamber 21 and the first conductive sub-chamber 22 constitute the reaction chamber of the plasma processing apparatus.

The insulating sub-chamber 21 is made of insulating material, preferably ceramic or quartz; the first conductive sub-chamber 22 is made of metal material, preferably stainless steel or aluminum. Wherein, the first conductive sub-chamber 22 is grounded.

The whole of the top cover 25 may function as a metal target, a magnetron 27 is provided on the metal target 25 (the top cover 25), a direct current power supply 28 applied a direct-current power to the metal target. An electrostatic chuck 29 is provided on the bottom of the reaction chamber and is opposite to the metal target, for supporting the wafer to be processed (not shown in the Figure). The electrostatic chuck 29 may include a heating device or a cooling device therein. A gas inlet (not shown in the Figure) is provided in the center or on the edge of the top cover 25 and is used to deliver process gas into the reaction chamber, and a gas outlet (not shown in the Figure) is provided in the bottom wall of the first conductive sub-chamber 22, may be located around the electrostatic chuck and is used to exhaust the remaining gas outside of the reaction chamber.

The insulating sub-chamber 21 is externally surrounded by an induction coil 13, and the number of turns of the induction coil 13 may be 1 or more. The induction coil 13 is connected with a first RF power supply 14 via a first matching network 15, and couples the RF power delivered from the first RF power supply 14 and the first matching network 15 into the reaction chamber, so as to generate plasma. The frequency of the first RF power supply 14 may be 2 MHZ or 13 MHZ.

Preferably, a coil protection cover 18 is provided outside of the induction coil 13, and is used to prevent the electromagnetic field energy produced by the induction coil 13 from affecting the outside.

A Faraday shield component 10 made of metal material is provided inside of the insulating sub-chamber 21. The shape of the Faraday shield component is the same as that of the insulating sub-chamber 21. In the present embodiment, the Faraday shield component 10 is a hollow cylinder, specially referred to as a Faraday cup, whose radius is slightly smaller than that of the insulating sub-chamber 21. The position of the Faraday cup 10 in the reaction chamber corresponds to the position of the induction coil 13 outside of the insulating sub-chamber 21. In other embodiments of the present invention, the Faraday shield component 10 may be of other shapes.

The lower edge of the insulating sub-chamber 21 (close to the first conductive sub-chamber 22) is provided with a flange 211 facing toward the inside of the insulating sub-chamber 21, which is used to support the Faraday cup 10 mounted on the flange 211. The flange 211 may be a continuous ring or may be a plurality of protruding parts which are distributed along the inner side of the insulating sub-chamber at intervals, and functions to support the Faraday cup 10. In other embodiments of the present invention, the Faraday cup 10 can be mounted at the inner side of the insulating sub-chamber in other ways, for example, the Faraday cup is fixed at the inner side of the Faraday cup by bolted connection.

Figure 3:
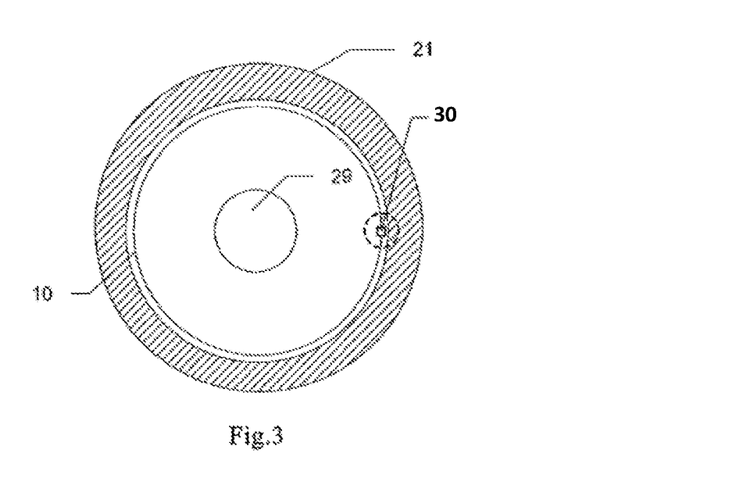
FIG. 3 is a cross-sectional view taken along the radial direction of the insulating sub-chamber of FIG. 2.
Figure 4:
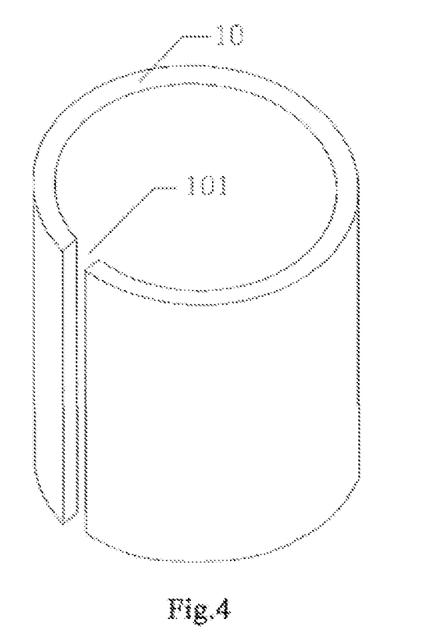
FIG. 4 is a schematic view of a three-dimensional structure of the Faraday cup in FIG. 2.

FIG. 3 is a cross-sectional view taken along the radial direction of the insulating sub-chamber of FIG. 2, and FIG. 4 is a cross-sectional view of the three-dimensional structure of the Faraday cup in FIG. 2. As shown in the figures, the Faraday cup 10 is provided with at least one slit 101, that is, the Faraday cup 10 is a non-continuous metal cup. At the position of the slit 101, the Faraday cup 10 is completely disconnected, and such a structure can effectively avoid eddy current loss and heating. Preferably, the slit 101 is provided along the axial direction of the Faraday cup 10.

In the embodiment, the Faraday cup 10 functions as Faraday shield, and the induction coil 13, the insulating sub-chamber 21 and the Faraday cup 10 constitute an induction coil system, since the inductance of the Faraday cup 10 is relatively small, compared with a coil in the metal chamber of the conventional technology (see FIG. 1), the voltage on the Faraday cup 10 under the same input power is relatively low. So the RF bias on the inner surface of the Faraday cup 10 is relatively low, and this can effectively prevent particles such as metal ions depositing on the Faraday cup 10 during the process, which can avoid the wafer contamination due to particles formed when the coil is sputtered, and can prevent the useless loss of the target material so as to improve the utilization efficiency of the target.

Moreover, the relatively low bias prevents the Faraday cup 10 from attracting the ion bombardment and becoming a wearing part, so the working life of the apparatus can be increased and the cost can be reduced. Wherein, the first conductive sub-chamber 22 functions as a grounding terminal of the RF and direct current loop, so that the normal discharge and maintenance of the plasma can be ensured.

Preferably, the slit 101 is filled with insulating material 30, and the insulating material can be ceramic or quartz, which can prevent the metal ion sputtered out of the target depositing on the inner wall of the insulating sub-chamber 21 outside of the Faraday cup, so the slit of the Faraday cup 10 is prevented from being short-circuited under severe metal ion deposition. The insulating material is preferably ceramic etc, and is provided at the slit of the Faraday cup 10, which can ensure that the coverage of the sputtered metal ion will not result in a short circuit.

Moreover, the Faraday cup 10 is not limited to be made of metal material and may be made of insulating material whose surface is electroplated with a conductive coating.

In a preferable embodiment of the present invention, the plasma processing apparatus further includes a first blocking component 31 and/or a second blocking component 32.

As shown in FIG. 2, the first blocking component 31 is provided at the joint of the flange 211 and the Faraday cup 10, and extends toward the direction of the first conductive sub-chamber 22 in a suspended state. The first blocking component 31 is circular ring-shaped, the cross section thereof taken along the radius is of "L" shape, one end thereof is attached on the flange 211 of the insulating sub-chamber 21, and the suspended extending part blocks the slot between the insulating sub-chamber 21 and the first conductive sub-chamber 22 so that metal ions can be prevented from depositing on the slot between the insulating sub-chamber 21 and the first conductive sub-chamber 22 which may otherwise result in conductive connection, and the stable floating potential on the Faraday cup 10 during the discharge of plasma can be ensured.

The second blocking component 32 is provided at the joint of the insulating sub-chamber 21 and an isolation component 26, and extends toward the direction of the insulating sub-chamber 21. The second blocking component 32 is circular ring-shaped, the cross section thereof taken along the radius is of "L" shape, and the suspended extending part blocks the connection between the insulating sub-chamber 21 and the isolation component 26. Obviously, the effect of the second blocking component 32 is similar to that of the first blocking component 31, so that metal ions can be prevented from depositing on the slot between the insulating sub-chamber 21 and the isolation component 26 which may otherwise result in conductive connection, and the stable floating potential on the Faraday cup 10 during the discharge of plasma can be ensured.

The first blocking component 31 is preferably made of ceramic material etc, and the second blocking component 32 is preferably made of metal material such as aluminum. Preferably, the isolation component 26 is provided between the second blocking component 32 and the top cover 25, and the isolation component 26 is made of insulating material so as to maintain the electrical insulation between the top cover 25 and the second blocking component 32, which will make the second blocking component 32 have a separate potential.

An isolation component is further provided between the top cover 25 and the insulating sub-chamber 21. Specially, the isolation component 26 is provided between the second blocking component 32 and the top cover 25 so as to make the top cover 25 and the second blocking component 32 isolated and insulated from each other, which ensures the normal discharge of the process gas in the chamber.

In fact, the plasma processing apparatus of the present invention may further include a second conductive sub-chamber, that is, three sub-chambers are superposed, which will described in the following embodiments.

The Second Embodiment

Figure 5:
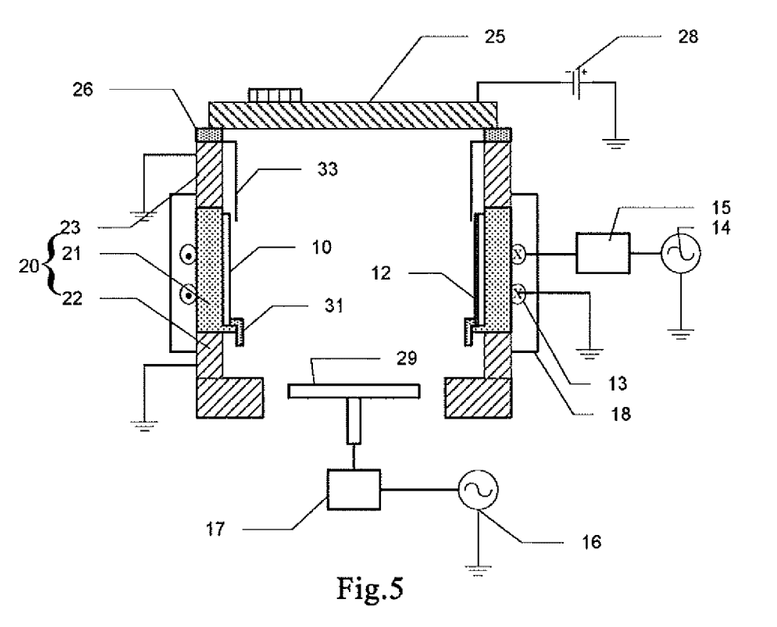
FIG. 5 is a schematic view of a structure of the plasma processing apparatus according to a second embodiment.

FIG. 5 is a schematic view of a structure of the plasma processing apparatus according to the second embodiment. As shown in the Figure, the plasma processing apparatus further includes a second conductive sub-chamber 23 which is superposed on the insulating sub-chamber 21. The second conductive sub-chamber 23 is made of metal material. That is, the plasma processing apparatus consists of the insulating sub-chamber 21, the first conductive sub-chamber 22 and the second conductive sub-chamber 23 which are superposed; the insulating sub-chamber 21 provided in the middle is made of ceramic material, and the second conductive sub-chamber 23 and the first conductive sub-chamber 22 provided above and below the insulating sub-chamber 21 respectively are made of metal material; the first conductive sub-chamber 22 is provided below the insulating sub-chamber 21 and the first conductive sub-chamber 22 is a cylindrical component provided with a bottom wall; the second conductive sub-chamber 23 is provided above the insulating sub-chamber 21, the top cover 25 is provided above the second conductive sub-chamber 23, and the top cover 25, the insulating sub-chamber 21, the first conductive sub-chamber 22 and the second conductive sub-chamber 23 together constitute the reaction chamber of the plasma processing apparatus.

In the embodiment, both the insulating sub-chamber 21 and the second conductive sub-camber 23 are hollow cylinders with substantially identical radius and the height thereof may be either identical or different based on the design requirements.

Preferably, the plasma processing apparatus further includes a third blocking component 33, which is provided at the joint of the second conductive sub-chamber 23 and the isolation component 26, and extends to the joint of the insulating sub-chamber 21 and the second conductive sub-chamber 23 in a suspended state; the third blocking component 33 is cylindrical and the cross section thereof taken along the radius direction is also of "L" shape, one end thereof is mounted at the joint of the isolation component 26 and the second conductive sub-chamber 23, and the suspended extension part blocks the connection between the insulating sub-chamber 21 and the second conductive sub-chamber 23, so as to prevent the metal ion deposition. The third blocking component 33 is preferably made of metal material such as aluminum.

The isolation component 26 is provided between the second conductive sub-chamber 23 and the top cover 25. Specially, the isolation component 26 is provided between the third blocking component 33 and the top cover 25 so as to make the top cover 25 and the second conductive sub-chamber 23 (as well as the third blocking component 33) isolated and insulated from each other, ensuring that the second conductive sub-chamber 23 has a separate potential and ensuring the normal discharge of the process gas in the chamber.

The structures and positions of the induction coil and the Faraday shield component 10 in the induction coil system are all the same as those in the first embodiment and will be omitted here. The coil protection cover 18 is made of metal material, connects the second conductive sub-chamber 23 and the first conductive sub-chamber 22 electrically and is grounded via the first conductive sub-chamber 22. In addition, the second conductive sub-chamber 23 may be grounded individually.

In the plasma processing apparatus of the present embodiment, grounded components (that is, the first conductive sub-chamber 22 and the second conductive sub-chamber 23) are at the same time provided above and below the Faraday shield component 10 to ensure the discharge and stable maintenance of the plasma. Blocking components (that is, the first blocking component 31 and the third blocking component 33) are provided above and below the Faraday shield component 10 to ensure that the Faraday shield component 10 maintains a stable floating potential at the discharge of the plasma.

The RF power delivered from the first RF power supply 14 and the first matching network 15 is coupled into the chamber to generate high-density plasma. The frequency of the first RE power supply 14 may be 2 MHZ or 13 MHZ. The second RF power supply 16 couples the RF power to the electrostatic chuck 29 (the wafer holder) via the second matching network 17 so as to generate the RF bias.

Figure 6:
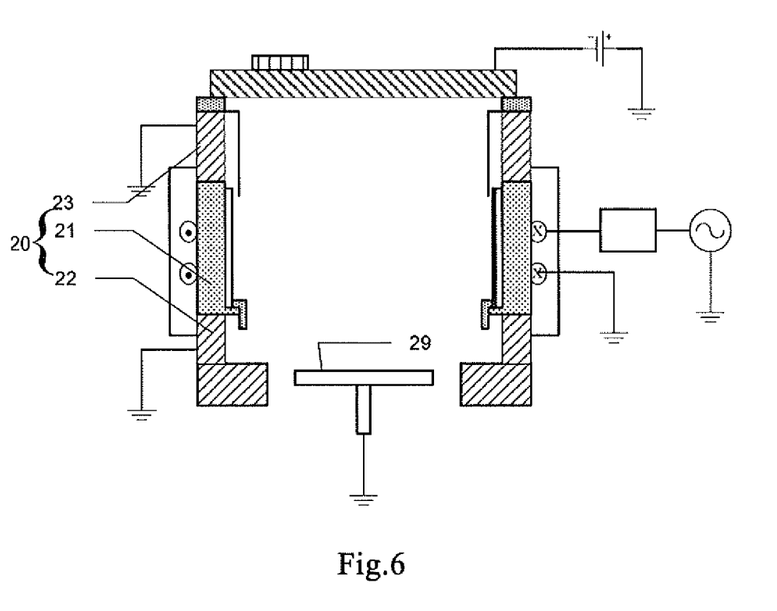
FIG. 6 is a schematic view of a structure of the plasma processing apparatus according to another embodiment of the present invention.

In another embodiment of the present invention, the second RF power supply and the second matching network may be omitted from the plasma processing apparatus. As shown in FIG. 6, the electrostatic chuck 29 is grounded directly, both the first conductive sub-chamber 22 and the second conductive sub-chamber 23 are grounded, and this apparatus is used in the manufacturing process in which the RF bias is not needed.

All the above embodiments are shown taken the PVD apparatus provided with the induction coil (for example, the magnetron sputtering apparatus) as examples, and in fact, the apparatus may be a plasma etching apparatus or a plasma chemical vapor deposition apparatus.

The above embodiments are only the preferred embodiments and will not limit the present invention in any form.

Although the present invention has been disclosed with the preferred embodiments as above, the present invention is not limited thereto. Any person skilled in the art can make many possible modifications and amendments to the technical solutions of the present invention or change them into equivalent embodiments using the above disclosed methods and technical contents without departing from the protection scope of the technical solutions of the present invention. So, all of the simple modifications, equivalent changes and substitutions made according to the technical substance of the present invention of the above embodiments without departing from contents of the technical solutions of the present invention will fall within the scope of the technical solutions of the present invention.

What is claimed is:
1. A plasma processing apparatus, comprising:
a chamber including a first conductive sub-chamber and an insulating sub-chamber arranged on top of the first conductive sub-chamber, such that the first conductive sub-chamber directly contacts the insulating sub-chamber, wherein:

the first conductive sub-chamber includes a first sidewall forming a first space inside the first conductive sub-chamber, and the insulating sub-chamber includes a second sidewall forming a second space inside the insulating sub-chamber, an inner radius of the first sidewall is approximately equal to an inner radius of the second sidewall, and the second sidewall of the insulating sub-chamber is stacked on top of the first sidewall of the first conductive sub-chamber, the first conductive sub-chamber is made of a metal material and electrically grounded, and the insulating sub-chamber is made of an insulating material, and the insulating sub-chamber has a flange at a bottom of the insulating sub-chamber, the flange extending towards a centerline of the plasma processing apparatus;

a target located above the chamber, a surface of the target contacting a processing space, that includes the first space and the second space, inside the chamber;

a Faraday shield component including an axial height less than an axial height of the insulating sub-chamber and provided inside the insulating sub-chamber, wherein:

a bottom end of the Faraday shield component directly contacts a top surface of the flange of the insulating sub-chamber and arranged on the flange, the Faraday shield component is made of a metal material or an insulating material electroplated with conductive coatings, and the Faraday shield component includes at least one slit in an axial direction along a full length of the Faraday shield component, the at least one slit being filled with an insulating material, a first blocking component comprising a first part and a second part, wherein:

the first part connects with the second part to form an L shape in a cross section taken along the inner radius of the second sidewall, the first part and the bottom end of the Faraday shield component are arranged next to each other on the top surface of the flange, the second part extends downward and parallels with the first sidewall of the first conductive sub-chamber, the second part being suspended off the flange by the first part and configured to block a slot between the insulating sub-chamber and the first conductive sub-chamber, and the first blocking component is made of a ceramic material;

a second blocking component comprising a third part and a fourth part, wherein:

the third part connects with the fourth part to form another L-shape in the cross section taken along the inner radius of the second sidewall, the third part is provided on a top surface of the insulating sub-chamber, and the fourth part extends downward and parallels with the second sidewall of the insulating sub-chamber, the fourth part being suspended off the top surface of the insulating sub-chamber by the third part; and an induction coil entirely arranged outside the second sidewall of the insulating sub-chamber, the insulating sub-chamber being surrounded by the induction coil.

2. The plasma processing apparatus according to claim 1, wherein the insulating sub-chamber has a cylindrical shape, and the flange has a smaller inner radius than the inner radius of the second wall of the insulating sub-chamber.

3. The plasma processing apparatus according to claim 1, wherein the Faraday shield component has a cylindrical shape.

4. The plasma processing apparatus according to claim 1, further comprising an isolation component provided between the target and the insulating sub-chamber.

5. The plasma processing apparatus according to claim 1, further comprising a coil protection cover provided outside of the induction coil.

6. The plasma processing apparatus according to claim 1, wherein the plasma processing apparatus is a physical vapor deposition device.

7. The plasma processing apparatus according to claim 1, wherein the insulating material filling in the at least one slit of the Faraday shield component is ceramic or quartz.

8. The plasma processing apparatus according to claim 1, wherein the insulating sub-chamber, the first conductive sub-chamber, and the Faraday shield component are formed in co-axial cylindrical shapes.

9. The plasma processing apparatus according to claim 1, wherein the insulating sub-chamber is ceramic or quartz.

10. The plasma processing apparatus according to claim 1, wherein the second blocking component is made of a metal material.

11. The plasma processing apparatus according to claim 1, wherein the flange, at the bottom of the insulating sub-chamber, comprises a plurality of protruding parts distributed on an inner side of the second sidewall of the insulating sub-chamber at intervals.

12. The plasma processing apparatus according to claim 1, further comprising an electrostatic chuck provided at a bottom of the processing space, the electrostatic chuck being electrically grounded or being connected with a radio frequency (RF) power supply.

13. The plasma processing apparatus according to claim 4, wherein the second blocking component is provided between the insulating sub-chamber and the isolation component.

14. A plasma processing apparatus, comprising: a chamber including a first conductive sub-chamber, a second conductive sub-chamber, and an insulating sub-chamber arranged on top of the first conductive sub-chamber, such that the first conductive sub-chamber directly contacts the insulating sub-chamber, wherein:

the first conductive sub-chamber includes a first sidewall forming a first space inside the first conductive sub-chamber, and the insulating sub-chamber includes a second sidewall forming a second space inside the insulating sub-chamber, an inner radius of the first sidewall is approximately equal to an inner radius of the second sidewall, and the second sidewall of the insulating sub-chamber is stacked on top of the first sidewall of the first conductive sub-chamber, the first conductive sub-chamber is made of a metal material and electrically grounded, and the insulating sub-chamber is made of an insulating material, the second conductive sub-chamber is provided between an isolation component and the insulating sub-chamber, the isolation component being disposed between the second conductive sub-chamber and the target, and the insulating sub-chamber has a flange at a bottom of the insulating sub-chamber, the flange extending towards a centerline of the plasma processing apparatus;

a target located above the chamber, a surface of the target contacting a processing space, that includes the first space and the second space, inside the chamber;

a Faraday shield component including an axial height less than an axial height of the insulating sub-chamber and provided inside the insulating sub-chamber, wherein:

a bottom end of the Faraday shield component directly contacts a top surface of the flange of the insulating sub-chamber and arranged on the flange, the Faraday shield component is made of a metal material or an insulating material electroplated with conductive coatings, and the Faraday shield component includes at least one slit in an axial direction along a full length of the Faraday shield component, the at least one slit being filled with an insulating material;

a first blocking component comprising a first part and a second part, wherein:

the first part connects with the second part to form an L shape in a cross section taken along the inner radius of the second sidewall, the first part and the bottom end of the Faraday shield component are arranged next to each other on the top surface of the flange, the second part extends downward and parallels with the first sidewall of the first conductive sub-chamber, the second part being suspended off the flange by the first part and being configured to block a slot between the insulating sub-chamber and the first conductive sub-chamber, and the first blocking component is made of a ceramic material;

a third blocking component comprising a third part and a fourth part, wherein:

the third part connects with the fourth part to form another L-shape in the cross section taken along the inner radius of the second sidewall, the third part is provided between the second conductive sub-chamber and the isolation component and arranged on a top surface of the second conductive sub-chamber, and the fourth part extends downward and parallels with a sidewall of the second conductive sub-chamber, the fourth part being suspended off the top surface of the second conductive sub-chamber by the third part; and an induction coil entirely arranged outside the second sidewall of the insulating sub-chamber, the insulating sub-chamber being surrounded by the induction coil.

15. The plasma processing apparatus according to claim 14, further comprising the isolation component made of an insulating material.

16. The plasma processing apparatus according to claim 14, further comprising a coil protection cover provided outside the induction coil.

17. The plasma processing apparatus according to claim 14, wherein the first conductive sub-chamber, the second conductive sub-chamber, the insulating sub-chamber, and the Faraday shield component are formed in co-axial cylindrical shapes.

18. The plasma processing apparatus according to claim 14, wherein the third blocking component is made of a metal material.

19. The plasma processing apparatus according to claim 14, further comprising the electrostatic chuck provided at a bottom of the processing space, the electrostatic chuck being electrically grounded or being connected with a radio frequency (RF) power supply.

* * * * *